United States Patent
Chen et al.

(10) Patent No.: US 7,173,472 B2
(45) Date of Patent: Feb. 6, 2007

(54) INPUT BUFFER STRUCTURE WITH SINGLE GATE OXIDE

(75) Inventors: Kuo-Ji Chen, Taipei (TW); Tsung-Hsin Yu, Hsinchu (TW); Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 140 days.

(21) Appl. No.: 10/859,726

(22) Filed: Jun. 3, 2004

(65) Prior Publication Data

US 2005/0270079 A1    Dec. 8, 2005

(51) Int. Cl.
*H03L 5/00* (2006.01)
(52) U.S. Cl. .................... 327/333; 327/206; 326/81
(58) Field of Classification Search .............. 327/206, 327/333; 326/81
See application file for complete search history.

(56) References Cited

U.S. PATENT DOCUMENTS

| | | | | |
|---|---|---|---|---|
| 5,917,339 A | * | 6/1999 | Kim | 326/68 |
| 6,288,599 B1 | | 9/2001 | Coddington | 327/530 |
| 6,346,829 B1 | * | 2/2002 | Coddington | 326/81 |
| 6,683,486 B2 | * | 1/2004 | Hanson et al. | 327/333 |
| 6,690,222 B2 | * | 2/2004 | Nair | 327/205 |
| 2001/0002797 A1 | * | 6/2001 | Nebel | 326/81 |
| 2004/0104756 A1 | * | 6/2004 | Payne | 327/333 |

OTHER PUBLICATIONS

Wang et al., "Level Shifters for High-Speed 1-V to 3.3-V Interfaces in a 0.13 um Cu-Interconnection/Low-k CMOS Technology", 2001 IEEE, pp. 307-310.

* cited by examiner

Primary Examiner—Long Nguyen
(74) Attorney, Agent, or Firm—Duane Morris LLP

(57) ABSTRACT

An input buffer for interfacing a high voltage signal received at an input node to a low voltage circuit comprising low voltage devices is provided. The buffer includes a threshold adjustment circuit including an inverter coupled to a threshold adjusted output node. The inverter includes low voltage devices and is coupled between a high supply voltage node and a ground node. The inverter includes a first and second transistors having biasing nodes coupled to a low voltage supply node of the low voltage circuit and coupled to the threshold adjusted output node. The adjustment circuit provides at the threshold adjusted output node an inverted signal corresponding to the high voltage input signal. The buffer also includes a level shifting circuit including low voltage devices and provides a low voltage signal corresponding to the high voltage input signal in response to said inverted signal.

23 Claims, 6 Drawing Sheets

INPUT BUFFER STRUCTURE WITH SINGLE GATE OXIDE

FIELD OF THE INVENTION

The present invention is related to integrated circuits and more specifically to integrated circuits including input buffer circuits.

BACKGROUND OF THE INVENTION

In the integrated circuit (IC) industry, input buffer circuitry is fabricated on a periphery of an integrated circuit die and electrically connected between an external pin of the integrated circuit and internal circuitry within the IC. In essence, the input buffer circuitry is an interface between the internal IC circuitry and an external environment outside of the IC so that data can be communicated from the external environment into and out from the integrated circuit.

Integrated circuits (ICs) are routinely designed such that one integrated circuit in an electrical system operates at a first power supply voltage and a second integrated circuit operates using a different power supply voltage level. For example, a first common voltage supply in the industry is roughly a 5.0 volts, a second voltage supply used in the industry is roughly 3.3 volts, a third voltage commonly used in the industry is roughly 2.5 volts, and a fourth commonly used voltage supply level is roughly 1.8 volts where any electrical system may contain one or more devices operating at these voltage levels. As an example, a 5.0 volt part may need to interface to a 1.8 volt part wherein the input buffer that is used to communicate between these two parts must be able to handle the discrepancy in voltage while still rendering acceptable performance. Due to the fact that there are several different common power supply voltage levels which are readily available in the industry, communication between these different devices has become more complex. Input and/or output buffers must now ensure interoperability of these different devices while maintaining optimal performance, if possible. Therefore, the design of such buffers has become increasingly more difficult and increasingly more important in the IC industry.

FIG. 2 illustrates a conventional two stage input buffer 200 that is suitable for interfacing a circuit operating at a first voltage to a second integrated circuit operating at a second voltage. In this illustrated example, pad 105 receives a signal, e.g., a digital data signal with a high peak voltage of VDDPST from a high voltage circuit (not shown). The buffer 200 provides an output signal at a lower voltage at circuit pad 107, e.g., a digital signal with peak voltage at the lower operating voltage VDD of the integrated circuit. Level down circuit 210, which converts the higher voltage VDDPST to the lower voltage VDD, is essentially a two stage inverter circuit comprising transistors forming first inverter 220 and second inverter 230 coupled at node 225. In this prior art circuit, inverter 220 serves as an input threshold control buffer and inverter 230 provides the VDDPST to VDD level down operation. To reduce leakage current induced by the P/N MOS devices of inverters 220 and 230, the channel width of these devices are small. These inverters may not be able to provide sufficient driving current. Therefore, inverter 150' acts as a buffer stage to provide sufficient driving current, thereby requiring inverter 150 to invert the signal provided by inverter 230 at node 235.

The two-stage interface shown in FIG. 2 requires devices having different oxide thicknesses. Transistors in inverters 220 and 230 require thick oxides that can operate at the higher voltages provided at pad 105, and stages 150 and 150' utilize transistors having thinner gate oxides that operate at the lower voltage VDD. This dual gate oxide structure increases both the complexity and cost of the IC fabrication process, as additional mask structures and processing steps are required to provide the dual gate structure.

To reduce the fabrication cost and complexity, the input buffer should comprise only devices having thin oxide layers. Gate oxide reliability, however, is critical in an input buffer that includes only devices having thin oxides. All voltage drops (e.g., Vgs and Vgd) in a transistor should be less than the oxide breakdown voltage to ensure that the circuit can operate for a reasonable lifetime. FIG. 1 illustrates a prior art input buffer 100 that is commonly used in the integrated circuit industry that includes only thin oxide devices. The buffer of FIG. 1 is fabricated on an IC die and allows two integrated circuits with different power supply voltages to interface to one another. The integrated circuit incorporating the circuit 100 contains a chip pad 105 that is used to receive input data from external to the integrated circuit. An input signal provided to the chip pad/terminal 105 passes through a resistive element 112 and is communicated through an input pass transistor 114. The transistor 114 of FIG. 1 has a gate/control electrode that is coupled to the operating voltage VDD of the integrated circuit chip.

The transistor 114 ensures that the inverter input node 109 does not rise to a voltage level that can damage the transistors 118 and 120. Specifically, any voltage provided on the chip pad 105 through the resistor 112 will be limited at VDD-Vthn (the threshold voltage of transistor 114) when communicated through the transistor 114 making the voltage at the inverter node 109 less than VDDPST when VDDPST in FIG. 1 is greater than VDD. In short, transistor 114 protects the transistors 118 and 120 from a damaging overvoltage occurrence that may occur when an integrated circuit operating at a high power supply voltage is coupled to the integrated circuit operating at the low power supply voltage VDD.

The input signal initially provided through the chip pad 105 is then provided via the inverter input node 109 to the inverter comprising transistors 118 and 120. The inverter, comprising transistors 118 and 120, is connected to a ground potential and an internal VDD voltage. The VDD voltage is a voltage that is supplied to operate all the circuitry on the integrated circuit including the input buffer 100. Typically, VDD can be any voltage but is usually 2.5 volts, 1.8 volts, 1.5 volts, 1.2 volts, 1.0 volt or 0.8 volts in modern high performance low power microprocessors and memory. The inverter, comprising the transistors 118 and 120, buffers the input signal to node 130 with logical inversion. Because the input voltage at node 109 is limited to VDD−Vthn, the PMOS 118 is always on and leakage current can become a problem. PMOS transistor 116 is provided to ensure that the VDD to ground path can be turned off as VPAD exceeds VDD−|Vthp|, where Vthp is the threshold voltage of PMOS 116. The output voltage of level down inverter 110 is then inverted through the inverter 150 comprising transistors 152 and 154, thereby providing output voltage at the node 107 between 0–VDD from a 0–VDDPST signal applied at input node 105. This signal provided at node 107 is routed to functional circuitry (not shown) located within the integrated circuit containing the circuit 100 so that incoming information may be processed by the system.

The gate voltage of the transistors 118 and 120 is limited to VDD−Vthn. Consequently, the maximum Vgd and Vgs is less than VDD and no oxide stress is present in transistors 118 and 120 under all operating conditions. For transistor 116, the maximum Vgd and Vgs is VDDPST−VDD. No oxide degradation is encountered if VDDPST−VDD is less than the oxide breakdown voltage of PMOS 116.

While the circuit of FIG. 1 is commonly used and is an adequate input buffer in certain circumstances, the circuitry of FIG. 1 has several disadvantages. First, the inverter comprising transistors 118 and 120 is typically fixed to a trigger point that is very low relative to the peak-to-peak voltage received from pad 105. This trigger point is set to the threshold voltage of NMOS 120, e.g., 0.4–0.5 V. During the rising edge of the signal VPAD at pad 105, specifically between 0V and Vthn, both PMOS 116 and 118 are turned on. The output of stage 110 is VDD. When VPAD is greater than Vthn and less than VDD−|Vthp|, all transistors are on, and the voltage at node 130 goes from VDD to low. When VPAD exceeds VDD−|Vthp|, PMOS 116 turns off and the voltage at node 130 become 0V. This is not advantageous since the trigger point that is not roughly half way between VDDPST and ground and mismatched transistors are required to adjust the trigger point to within Vthn and VDD−|Vthp|.

To compensate for this noise margin problem, the transistors 118 and 120 can be fabricated with significantly different aspect ratios to statically fix the trigger point at yet another voltage value (e.g., 1.6 volts). This mismatching of the transistors 118 and 120 results in an imbalanced inverter that can have different operating characteristics when the inverter is transitioning from a high voltage to a low voltage and vice versa. Since timing constraints of external buses and the like are typically designed to the worse case transition, the mismatch in the transistors 118 and 120 that improves noise margins may impact the maximal speed at which the device can be operated.

As described above, the buffer circuit 100 suffers from a non-advantageous asymmetric transfer property and/or requires mismatched transistors. Therefore, there remains a need for a new single gate oxide input buffer, particularly a single gate oxide input buffer that eliminates or reduces this low threshold voltage problem.

SUMMARY OF THE INVENTION

An input buffer for interfacing a high voltage signal received at an input node to a low voltage circuit comprising low voltage devices is provided. The buffer includes a threshold adjustment circuit including an inverter coupled to a threshold adjusted output node. The inverter includes low voltage devices and is coupled between a high supply voltage node and a ground node. The inverter includes a first and second transistors having biasing nodes coupled to a low voltage supply node of the low voltage circuit and coupled to the threshold adjusted output node. The adjustment circuit provides at the threshold adjusted output node an inverted signal corresponding to the high voltage input signal. The buffer also includes a level shifting circuit including low voltage devices and provides a low voltage signal corresponding to the high voltage input signal in response to said inverted signal.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

Figure 1:
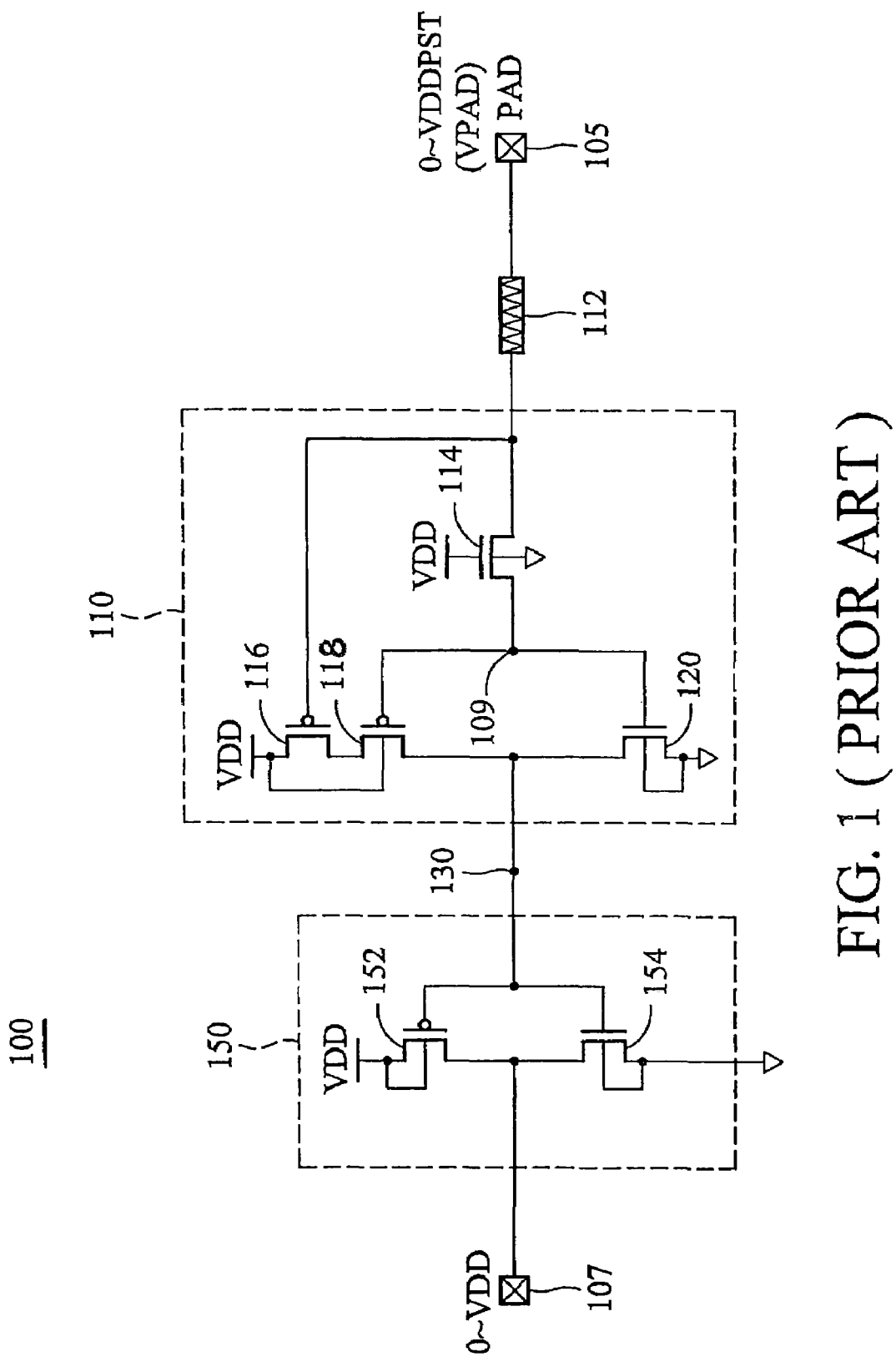
FIG. 1 illustrates a conventional single gate input buffer.
Figure 2:
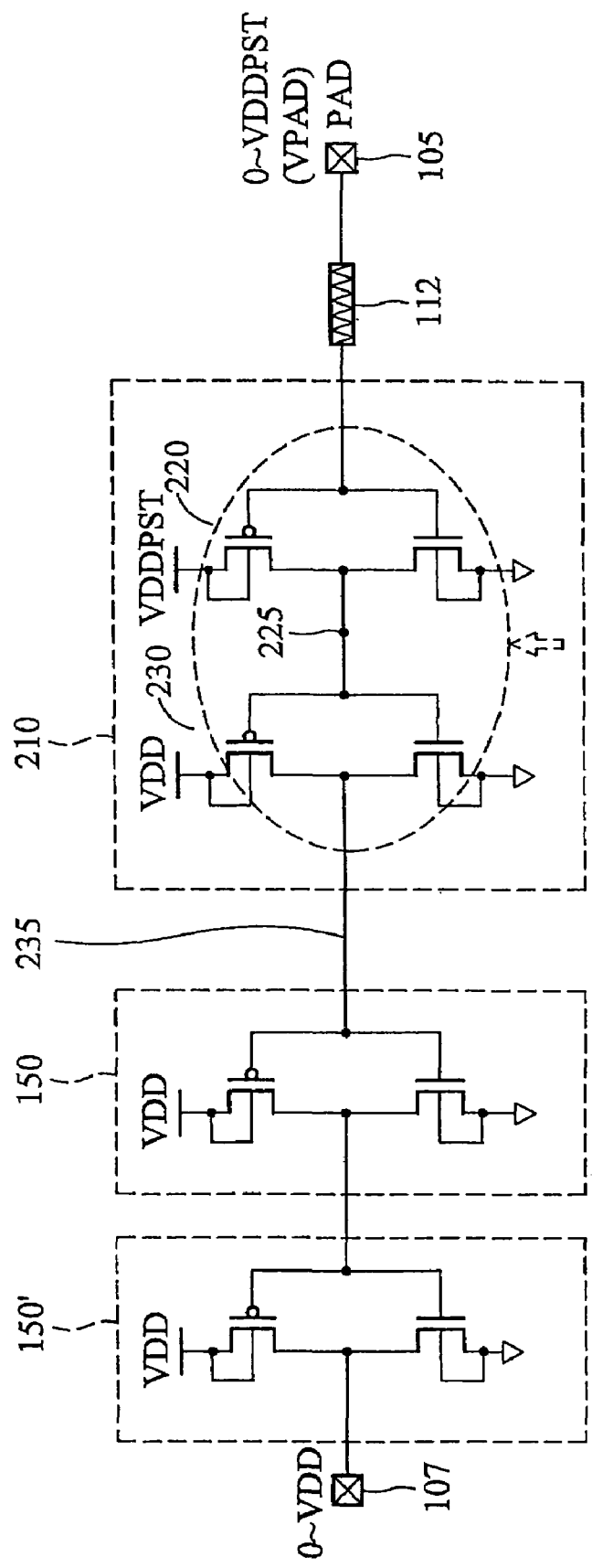
FIG. 2 illustrates a conventional dual gate input buffer.

It is to be understood that these drawings are solely for purposes of illustrating the concepts of the invention and are not intended as a definition of the limits of the invention. The embodiments shown in the figures herein and described in the accompanying detailed description are to be used as illustrative embodiments and should not be construed as the only manner of practicing the invention. Also, the same reference numerals, possibly supplemented with reference characters where appropriate, have been used to identify similar elements.

DETAILED DESCRIPTION

Figure 3:
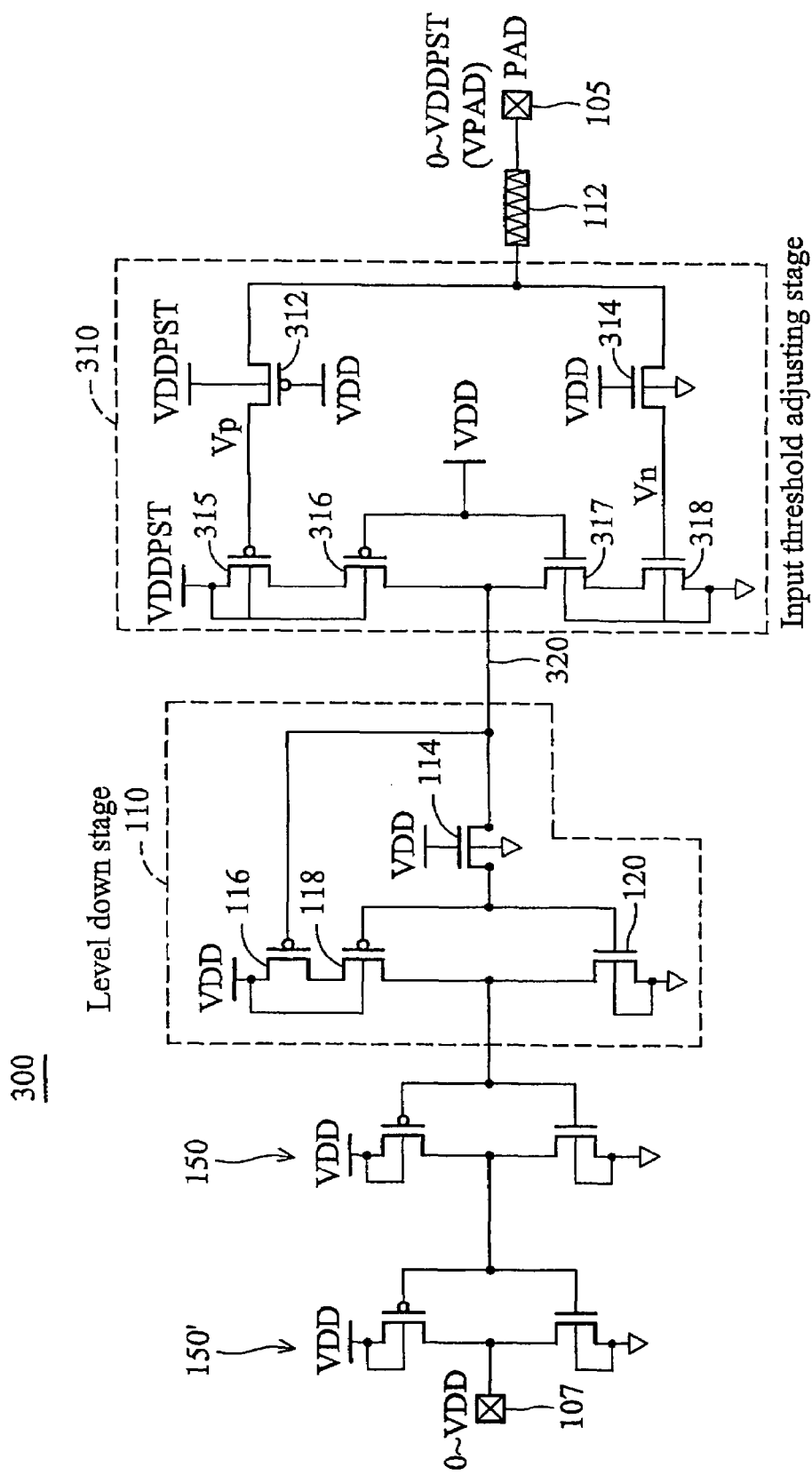
FIG. 3 illustrates a first exemplary embodiment of a single gate input buffer in accordance with the principles of the invention.

FIG. 3 illustrates an exemplary embodiment 300 of a single gate oxide input buffer. All transistors in circuit 300 can be fabricated as core low voltage devices, i.e., a dual gate design is not necessary. In this first embodiment, input threshold adjusting stage 310 generates an inverted form of the data signal received at pad 105 and sets the trigger point for level down stage 110 at half VDDPST, i.e., at the midpoint of the peak-to-peak transition of the input voltage VPAD. In one embodiment, the adjusting stage includes an inverter, comprising transistors 315 and 318, and includes two protection circuits. A first protection circuit includes PMOS devices 312 and 316 and protects transistor 315. A second protection circuit includes NMOS devices 314 and 317 and protects devices 318. Altogether, the transistors 312, 314, 315, 316, 317 and 318 provide voltage protection and perform an inversion function on the input signal at node 105 to provide an inverted output signal at threshold adjusted output node 320 that represents the input data provided via pad 105. PMOS pass gate 312 is biased with core supply voltage VDD. With the pass gate 312 biased with VDD, the gate voltage (Vp) of the PMOS 315 can be limited within VDDPST and VDD+|Vthp|, where Vthp is the threshold voltage of PMOS 312. NMOS pass gate 314 is also biased with VDD. The gate voltage (Vn) of the NMOS 318 is limited from 0 to VDD−Vthn (the threshold voltage of NMOS 314) through the VDD biased NMOS pass gate 314. PMOS 312 is turned off when VPAD is lower than VDD+|Vthp| and NMOS 314 is turned off when VPAD is higher than VDD−Vthn. By limiting the gate voltages applied to transistors 315 and 318 of the threshold adjusting stage, no reliability issues occur in the threshold point adjustment stage 310.

In one embodiment, buffer 300 includes level down shifter 110 described above coupled to threshold adjusted output node 320 of input threshold adjustment stage 310. The overall operation of the circuit 300 is described below.

During the rising edge of an input signal at 105, when the voltage in node 105 is less than VDD−Vthn, the voltage Vp at the gate electrode of PMOS 315 is VDD−|Vthp| due to the limitation of the VDD biased PMOS pass gate 312. The PMOS 315 turns on and the output voltage at node 320 is set to VDDPST through PMOS transistors 315 and 316. NMOS 318 is off. When the input voltage at pad 105 exceeds Vthn, the NMOS 318 turns on and the voltage at node 320 starts to reduce from VDDPST while both NMOS 318 and PMOS 315 are on. When the voltage at node 105 exceeds VDDPST−|Vthp|, PMOS 315 turns off and the voltage at node 320 is tied to ground (i.e., zero volts) byNMOS 317 and 318.

The voltage at node 320 remains at ground until the falling edge of the input signal at 105. At the falling edge of the input voltage at pad 105, PMOS 315 turns on as the input level becomes lower than VDDPST−|Vthp|. The output level at node 320 becomes VDDPST as the NMOS 318 turns off when the input level becomes lower than Vthn.

With the input threshold adjusting stage, the input threshold of level down stage 110 is adjusted to half VDDPST. This is shown in the simulation results illustrated in FIG. 6. The Y-axis of the graph indicates the measured voltages at node 320 and node 107 of FIG. 3. The X-axis of the graph corresponds to the input voltage at pad 105. In this simulation, VDDPST is 2.5V, VDD is 1.2V, Vthn is 0.5V and |Vthp| is 0.5V. The graph indicates that the output voltage at node 107 begins to rise from low (0V) to high (1.2V) when the input voltage VPAD at node 105 is approximately half VDDPST, i.e., when the voltage VPD is about 1.25V.

After the input adjustment stage, the output voltage of the adjustment stage 310 at node 320 is applied to the level down converter 110 of FIG. 1 to convert the input voltage VDDPST to output voltage VDD without the asymmetric transfer curve problem.

In one embodiment, the output of level down circuit 110 is then provided to inverter 150, which is coupled to second inverter 150'. These inverters serve two functions. First, the inverters provide a feedback path for a Schmitt trigger circuit described in connection with FIG. 4. Second, the inverters reduce leakage current during operation of he buffer 300. The second inverter 150' should be sized to provide a desired driving current for the integrated circuit. Without the inverters, the widths of the devices in the level shifter 110 should be made relatively large to provide this driving current, but thereby providing the potential for increased leakage current during operation of the buffer.

Figure 4:
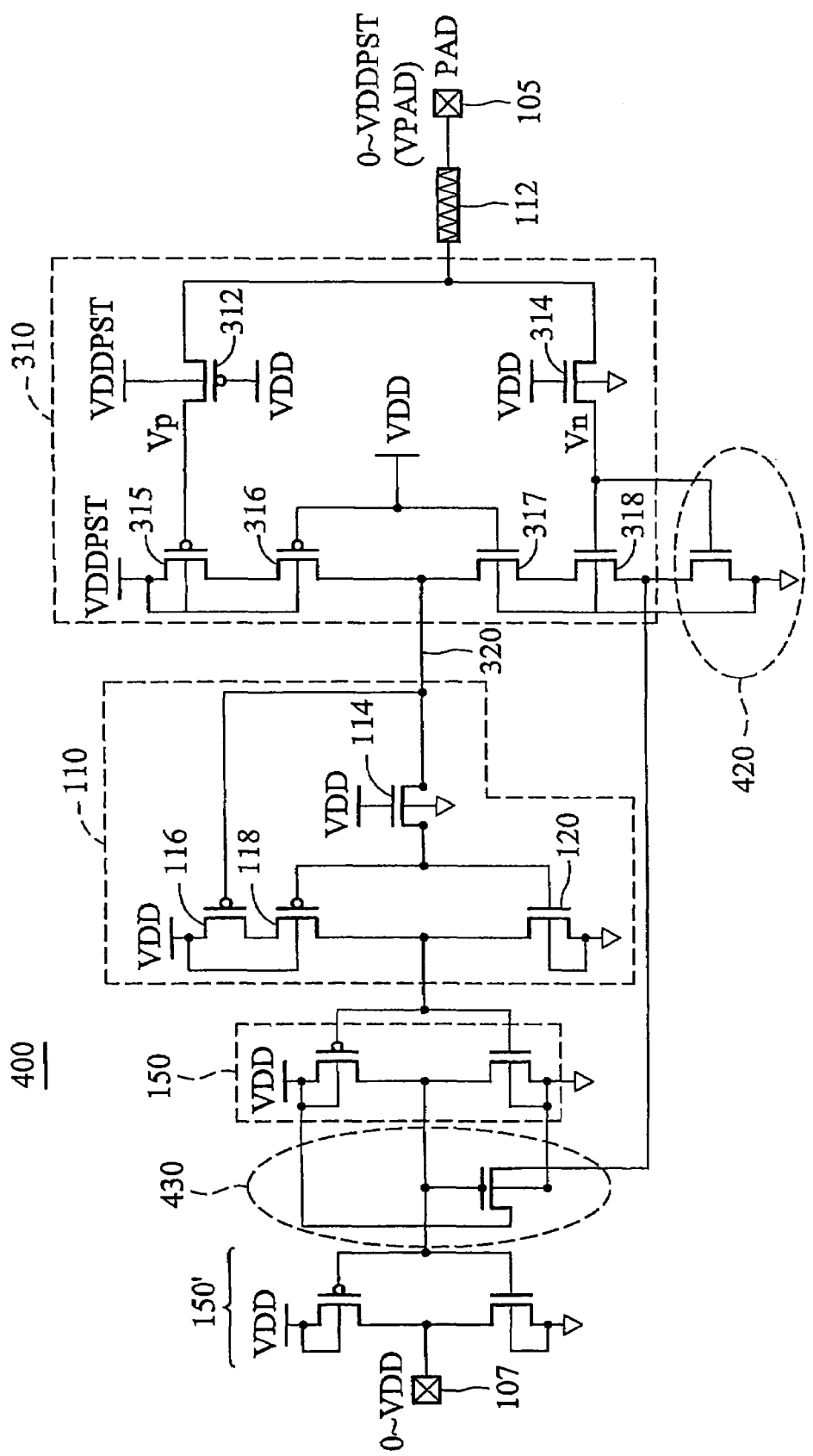
FIG. 4 illustrates a second exemplary embodiment of a single gate input buffer in accordance with the principles of the invention.

FIG. 4 illustrates a second exemplary embodiment 400 of a single gate oxide input buffer. In this embodiment, which is similar to that shown in FIG. 3, transistors 420 and 430 are incorporated to act as a Schmitt trigger. A Schmitt trigger is an electronic circuit that produces an output when the input exceeds a predetermined turn-on or threshold level. The output is maintained until the input falls below the threshold level.

Figure 6:
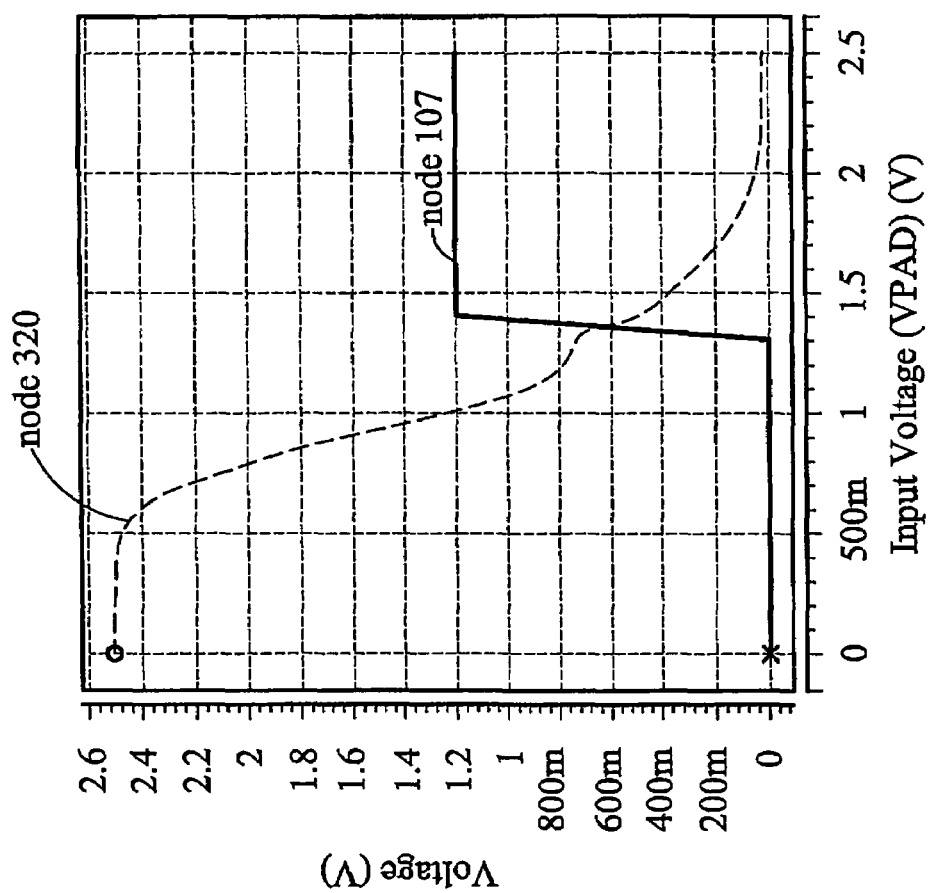
FIG. 6 is a graph of various voltages at nodes of the circuit of FIG. 3.

At the rising edge of the input level at pad 105, the output of the inverter stage 150 is high. The NMOS 430 is turned on and a feedback voltage of VDD−Vthn is passed to the drain of NMOS 420 and the low to high threshold point is thus increased. The source voltage at NMOS 318 is elevated through the feedback path. Therefore, the voltage Vn must be higher than Vthn to turn on NMOS 318, thereby increasing noise immunity. Assume, as shown in FIG. 6, that the trigger point for the embodiment 300 described above without the Schmitt trigger is 1.25V. The new trigger point for the rising edge of the input signal VPAD can be set to, for example, 1.5V or 1.75 V. For the falling edge of the input voltage at node 105 no feedback path is provided that affects the threshold point, which is set at 1.25V, in the example of FIG. 6. However, the high to low threshold point can be set to, for example, 1.0V to improve the noise margin by modifying the device ratios of transistors 315, 316, 317, an 318. The high trigger voltage in the rising edge and low trigger voltage in the falling edge characteristic of the Schmitt trigger input buffer embodiment improves noise margins.

Figure 5:
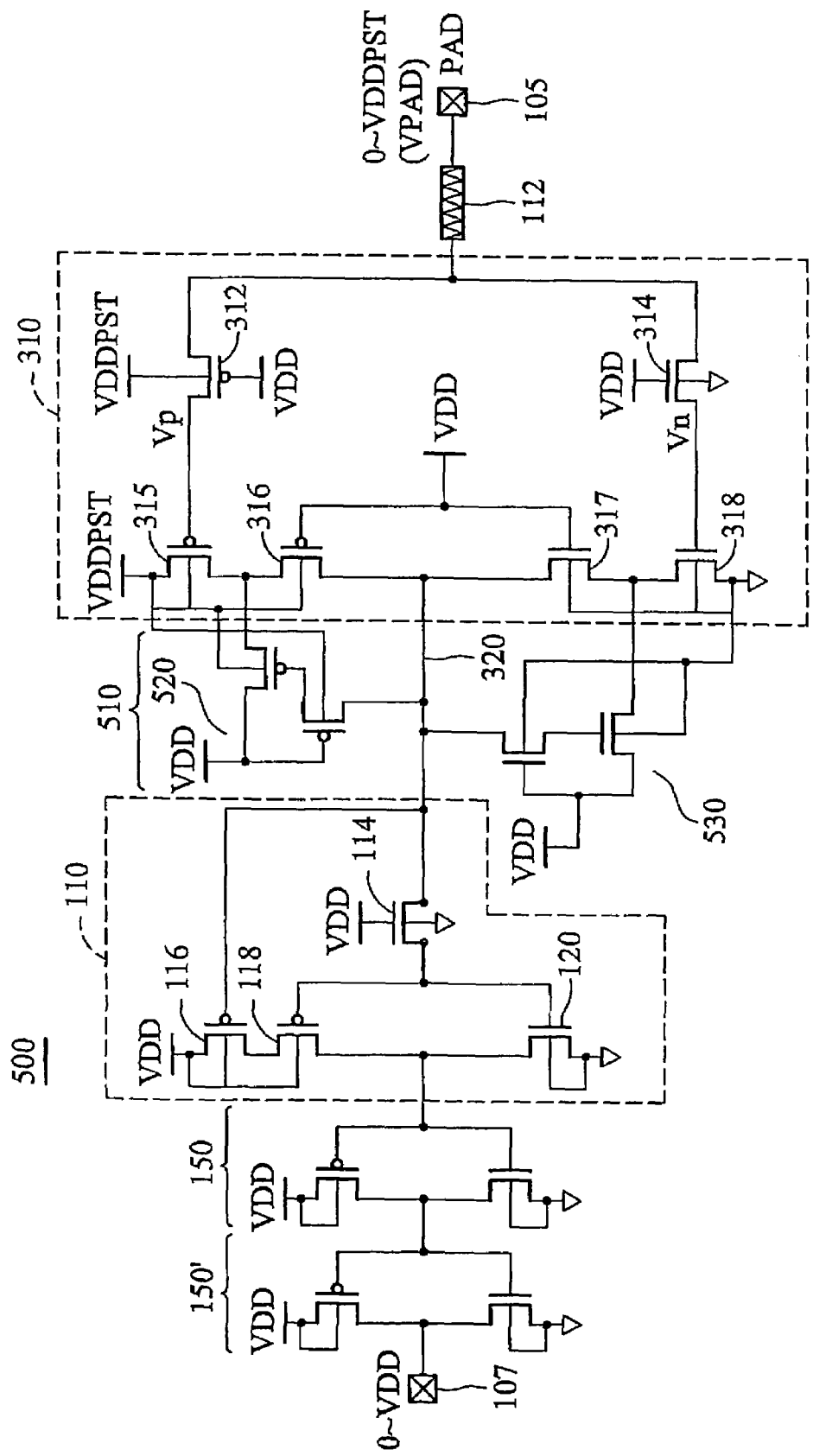
FIG. 5 illustrates a third exemplary embodiment of a single gate input buffer in accordance with the principles of the invention.

FIG. 5 illustrates a third exemplary embodiment 500 of a single gate oxide input buffer. In this embodiment circuit 510 is coupled between the threshold adjusting circuit 310 and level down stage 110. Circuit 510 comprises circuits 520 and 530 and operates as a Schmitt trigger in a manner similar to that shown in FIG. 4. Each circuit 520 and 530 includes a pair of cross-coupled transistors coupled between the output node 320 and the inverter of threshold adjustment stage 310. More specifically, during the rising edge of the input signal at pad 105, the output voltage of circuit 310 is VDDPST and a feedback voltage of VDD−Vthn is passed to the source of NMOS 318 via circuit 530. The output level of circuit 310 does not become zero until the NMOS 318 is fully turned on. As described in connection with FIG. 4, the low to high threshold point is elevated above half VDDPST due to the feedback voltage through 530.

During the falling edge of the signal at 105, the output voltage of adjustment stage 310 is 0V and a feedback voltage of VDD +|Vthp| is passed to the drain of transistor 315 through circuit 520. The output level does not become VDDPST until the PMOS 315 is fully turned on, thereby reducing the high to low input threshold below half VDDPST via the feedback voltage through circuit 520.

Per the foregoing, a single gate oxide input buffer is provided with an adjustable input threshold utilizing only low voltage devices and core and I/O supply voltages (i.e., no additional bias circuitry is required). The proposed circuits have been successfully verified with simulations. No oxide reliability issues were revealed as all Vgs, Vgd and Vgb voltages were observed to be within acceptable operating voltages less than VDD. Excellent AC and DC characteristics were also observed. Further, the elimination of the need for dual gate oxides eliminates the need for a second gate oxide mask, thereby providing cost savings and process simplification. The input buffer can comprise only low voltage devices. In some embodiments, the buffer includes a Schmitt trigger that improves noise margins.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An input buffer for interfacing a high voltage input signal received at an input node to a low voltage circuit comprising low voltage devices, the input buffer comprising:

a threshold adjustment circuit comprising an inverter coupled to a threshold adjusted output node, said inverter comprising low voltage devices and coupled between a high voltage supply node and a ground node, said inverter comprising a first and second transistors having biasing nodes coupled to a low voltage supply node of said low voltage circuit and coupled to said threshold adjusted output node, said threshold adjustment circuit providing at said threshold adjusted output node an inverted signal of said high voltage input signal; and a level shifting circuit comprising low voltage devices and coupled to said threshold adjusted output node, said level shifting circuit providing a low voltage signal corresponding to said high voltage input signal in response to said inverted signal,
wherein said level shifting circuit comprises a level shift circuit inverter coupled to said threshold adjusted output node through a pass gate transistor,
wherein said level shifting circuit inverter comprises a p-channel and n-channel transistor pair having respective biasing nodes coupled to said threshold adjusted output node through said pass gate transistor, said level shifting circuit further comprising a p-channel transistor coupled in a stack with the p-channel transistor of said p-channel and n-channel transistor pair and having a biasing node coupled to said threshold adjusted output node.

2. The input buffer of claim 1, wherein said first and second transistors comprise a first p-channel transistor and a first n-channel transistor, said inverter of said threshold adjustment circuit comprising a second p-channel transistor coupled between said first p-channel transistor and said high voltage supply node, and a second n-channel transistor coupled between said first n-channel transistor and the ground node.

3. The input buffer of claim 2, wherein said threshold adjustment circuit further comprises a pair of pass gate transistors,
wherein said second n-channel transistor and second p-channel transistor each have a respective biasing node coupled to said input node through a respective pass gate transistor from said pair of pass gate transistors.

4. The input buffer of claim 1, further comprising a pair of inverters coupled to an output of said level shifting circuit inverter, a first inverter from said pair of inverters having an input coupled to said output of said level shifting circuit inverter, and a second inverter from said pair of inverters having an input coupled to an output of said first inverter from said pair of inverters.

5. The input buffer of claim 4, further comprising a Schmitt trigger coupled between said second inverter from said pair of inverters and said input threshold adjustment circuit.

6. The input buffer of claim 5,
wherein said first and second transistors comprise a first p-channel transistor and a first n-channel transistor, said threshold adjustment circuit further comprising a second p-channel transistor coupled between said first p-channel transistor and the high voltage supply node, and a second n-channel transistor coupled between said first n-channel transistor and the ground node, and
wherein said Schmitt trigger comprises a pair of n-channel transistors.

7. The input buffer of claim 6, wherein said pair of n-channel transistors comprise a third n-channel transistor coupled between said second n-channel transistor and said ground node, and a fourth n-channel transistor coupled between said low voltage supply node and said third n-channel transistor,
wherein said second and third n-channel transistors each have a respective biasing node coupled to said input node through a pass gate transistor, and
wherein said fourth n-channel transistor has a biasing node coupled to an output of said first inverter from said pair of inverters.

8. The input buffer of claim 1, further comprising a Schmitt trigger element coupled between said input threshold adjustment circuit and said level shifting circuit.

9. The input buffer of claim 8,
wherein said first and second transistors comprise a first p-channel transistor and a first n-channel transistor, said inverter of said threshold adjustment circuit further comprising a second p-channel transistor coupled between said first p-channel transistor and the high voltage supply node, and a second n-channel transistor coupled between said first n-channel transistor and the ground node,
wherein said Schmitt trigger element comprises a first pair of cross coupled transistors and a second pair of cross coupled transistors.

10. An input buffer for interfacing a high voltage input signal received at an input node to a low voltage circuit comprising low voltage devices, comprising:
a level shifting circuit comprising low voltage devices, said level shifting circuit providing a low voltage signal corresponding to said high voltage input signal; and
a threshold adjustment circuit coupled to an input of said level shifting circuit, said threshold adjustment circuit comprising an inverter coupled to said level shifting circuit, said inverter comprising low voltage transistors and including a first transistor of a first conductivity type and a first transistor of a second conductivity, and an overvoltage protection circuit for providing overvoltage protection to said first transistors, said overvoltage protection circuit having a biasing node coupled to a low voltage supply node of said low voltage circuit, wherein said buffer further comprises a circuit module for causing said threshold adjustment circuit to provide a signal to said level shifting circuit in response to said high voltage input signal for setting a trigger point of said level shifting circuit at greater than half a peak voltage of said high voltage input signal during a rising transition of said high voltage input signal.

11. The input buffer of claim 10,
wherein said overvoltage protection circuit comprises a first overvoltage protection circuit for said first transistor of said first conductivity type and a second overvoltage protection circuit for said first transistor of said second conductivity type,
wherein said first overvoltage protection circuit comprises a second transistor of said first conductivity type coupled between said first transistor of said first conductivity type and a threshold adjusted output node and a third transistor of said first conductivity type coupled between said input node and a biasing nodes of said first transistor of said first conductivity type, and
wherein said second overvoltage protection circuit comprises a second transistor of said second conductivity type coupled between said first transistor of said second conductivity type and said threshold adjusted output node and a third transistor of said second conductivity type coupled between said input node and a biasing node of said first transistor of said second conductivity type.

12. The input buffer of claim 11, wherein said level shifting circuit comprises an inverter comprising a fourth transistor of said second conductivity type and a fourth transistor of said first conductivity type having respective biasing nodes coupled to said threshold adjusted output node through a pass gate transistor, said level shifting circuit further comprising a fifth transistor of said second conductivity type coupled in a stack with said fourth transistor of said second conductivity type and having a biasing node coupled to said threshold adjusted output node.

13. The input buffer of claim 10, further comprising a pair of inverters coupled to an output of said level shifting circuit, a first inverter from said pair of inverters having an input coupled to said output of said level shifting circuit, and a second inverter from said pair of inverters having an input coupled to an output of said first inverter from said pair of inverters.

14. The input buffer of claim 13, wherein said circuit module comprises a Schmitt trigger circuit, said Schmitt trigger circuit coupled between said second inverter from said pair of inverters and said input threshold adjustment circuit to set said trigger point of said level shifting circuit at greater than half the peak voltage of said high voltage input signal during the rising transition of said high voltage input signal.

15. The input buffer of claim 12, wherein said signal provided by said threshold adjustment circuit to said level shifting circuit further sets a trigger point of said level shifting circuit at or below half the peak voltage of said high voltage input signal during a falling transition of said high voltage input signal.

16. The input buffer of claim 10, wherein said circuit module comprises a Schmitt trigger element coupled between said input threshold adjustment circuit and said level shifting circuit to set said trigger point of said level shifting circuit at greater than half the peak voltage of said high voltage input signal during the rising transition of said high input voltage signal and below half the peak voltage of said high voltage input signal during said falling transition of said high voltage input signal.

17. A method of interfacing a high voltage input signal received at an input node to a low voltage circuit comprising low voltage devices, comprising:

providing a level shifting circuit comprising only low voltage devices, said level shifting circuit providing a low voltage signal corresponding to said high voltage input signal; and providing to said level shifting circuit with a threshold adjustment circuit a signal, said signal responsive to said high voltage input signal for setting a trigger point of said level shifting circuit at greater than half a peak voltage of said high voltage input signal during a rising transition of said high voltage input signal, wherein said threshold adjustment circuit comprises an inverter coupled to said level shifting circuit, said inverter comprising only low voltage transistors and including a first transistor of a first conductivity type and a first transistor of a second conductivity, and an overvoltage protection circuits for providing overvoltage protection to said first transistors, said overvoltage protection circuit having a biasing node coupled to a low voltage supply node of said low voltage circuit.

18. The method of claim 17, wherein said a threshold adjustment circuit for outputting said signal to said level shifting circuit sets a trigger point of said level shifting circuit at or below half the peak voltage of said high voltage input signal during a falling transition of said high voltage input signal.

19. The method of claim 18, wherein said signal sets said trigger points at greater than half the peak voltage of said high voltage input signal during said rising transition and less than half said peak voltage of said high voltage input signal during said falling transition.

20. An input buffer for interfacing a high voltage input signal received at an input node to a low voltage circuit comprising low voltage devices, the input buffer comprising:

a threshold adjustment circuit comprising an inverter coupled to a threshold adjusted output node, said inverter comprising low voltage devices and coupled between a high voltage supply node and a ground node, said inverter comprising a first and second transistors having biasing nodes coupled to a low voltage supply node of said low voltage circuit and coupled to said threshold adjusted output node, said threshold adjustment circuit providing at said threshold adjusted output node an inverted signal corresponding to said high voltage input signal;

a level shifting circuit comprising low voltage devices and coupled to said threshold adjusted output node, said level shifting circuit providing a low voltage signal corresponding to said high voltage input signal in response to said inverted signal; and a Schmitt trigger element coupled between said input threshold adjustment circuit and said level shifting circuit, said Schmitt trigger element comprising a first pair of cross coupled transistors and a second pair of cross coupled transistors.

21. The input buffer of claim 20, wherein said first and second transistors comprise a first p-channel transistor and a first n-channel transistor, said inverter of said threshold adjustment circuit further comprising a second p-channel transistor coupled between said first p-channel transistor and the high voltage supply node, and a second n-channel transistor coupled between said first n-channel transistor and the ground node.

22. An input buffer for interfacing a high voltage input signal received at an input node to a low voltage circuit comprising low voltage devices, the input buffer comprising:

a threshold adjustment circuit comprising an inverter coupled to a threshold adjusted output node, said inverter comprising low voltage devices and coupled between a high voltage supply node and a ground node, said inverter comprising a first and second transistors having biasing nodes coupled to a low voltage supply node of said low voltage circuit and coupled to said threshold adjusted output node, said threshold adjustment circuit providing at said threshold adjusted output node an inverted signal corresponding to said high voltage input signal;

a level shifting circuit comprising low voltage devices and coupled to said threshold adjusted output node, said level shifting circuit providing a low voltage signal corresponding to said high voltage input signal in response to said inverted signal; and means for causing said threshold adjustment circuit to set a trigger point of said level shifting circuit at greater than half a peak voltage of said high voltage input signal during a rising transition of said high voltage input signal.

23. The input buffer of claim 22, further comprising means for causing said threshold adjustment circuit to set a trigger point of said level shifting circuit at less than half the peak voltage of said high voltage input signal during a falling transition of said high voltage input signal.

* * * * *

UNITED STATES PATENT AND TRADEMARK OFFICE
CERTIFICATE OF CORRECTION

PATENT NO. : 7,173,472 B2
APPLICATION NO. : 10/859726
DATED : February 6, 2007
INVENTOR(S) : Kuo-Ji Chen, Tsung-Hsin Yu and Ker-Min Chen It is certified that error appears in the above-identified patent and that said Letters Patent is hereby corrected as shown below:

Column 5, line 7, delete "byNMOS" and insert therefore -- by NMOS --.

Column 5, line 25, delete "VPD" and insert therefore -- VPAD --.

Column 5, line 36, delete "he" and insert therefore -- the --.

Column 9, line 28, delete "input voltage" and insert therefore -- voltage input --.

Signed and Sealed this

Sixth Day of November, 2007

JON W. DUDAS
*Director of the United States Patent and Trademark Office*